United States Patent
Iwazaki et al.

(10) Patent No.: US 10,573,577 B2
(45) Date of Patent: Feb. 25, 2020

(54) METHOD FOR PRODUCING CERAMIC-ALUMINUM BONDED BODY, METHOD FOR PRODUCING POWER MODULE SUBSTRATE, CERAMIC-ALUMINUM BONDED BODY, AND POWER MODULE SUBSTRATE

(71) Applicant: MITSUBISHI MATERIALS CORPORATION, Tokyo (JP)

(72) Inventors: Wataru Iwazaki, Kumagaya (JP); Hiroya Ishiduka, Koshigaya (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 187 days.

(21) Appl. No.: 15/309,610

(22) PCT Filed: Jun. 25, 2015

(86) PCT No.: PCT/JP2015/068297
§ 371 (c)(1),
(2) Date: Nov. 8, 2016

(87) PCT Pub. No.: WO2016/002609
PCT Pub. Date: Jan. 7, 2016

(65) Prior Publication Data
US 2017/0141010 A1    May 18, 2017

(30) Foreign Application Priority Data
Jun. 30, 2014  (JP) ................................ 2014-134572

(51) Int. Cl.
| | | |
|---|---|---|
| *C04B 37/02* | (2006.01) | |
| *B32B 37/06* | (2006.01) | |
| *B32B 37/08* | (2006.01) | |
| *H01L 23/373* | (2006.01) | |
| *B32B 9/00* | (2006.01) | |
| *H01L 21/48* | (2006.01) | |

(52) U.S. Cl.
CPC .......... *H01L 23/3735* (2013.01); *B32B 9/005* (2013.01); *B32B 37/06* (2013.01); *C04B 37/025* (2013.01); *H01L 21/4882* (2013.01); *B32B 2309/105* (2013.01); *C04B 2237/16* (2013.01); *C04B 2237/366* (2013.01); *C04B 2237/402* (2013.01); *C04B 2237/525* (2013.01); *C04B 2237/60* (2013.01); *C04B 2237/706* (2013.01)

(58) Field of Classification Search
CPC ........ C04B 2237/402; C04B 2237/525; B32B 37/06; B32B 37/08
See application file for complete search history.

(56) References Cited

U.S. PATENT DOCUMENTS

| | | | |
|---|---|---|---|
| 2005/0145681 A1* | 7/2005 | Fuse ...................... | B23K 1/008 228/219 |
| 2005/0214518 A1* | 9/2005 | Nagase ............... | H01L 23/3735 428/210 |
| 2009/0267215 A1 | 10/2009 | Kitahara et al. | |

FOREIGN PATENT DOCUMENTS

| | | | |
|---|---|---|---|
| CN | 100364078 C | 1/2008 | |
| CN | 101646516 A | 2/2010 | |
| EP | 1498946 A1 | 1/2005 | |
| JP | 11-154776 A | 6/1999 | |
| JP | 2001-010874 A | 1/2001 | |
| JP | 2001-089257 A | 4/2001 | |
| JP | 2008-108993 A | 5/2008 | |
| JP | 2008108993 A * | 5/2008 | ......... H01L 23/3735 |
| JP | 2008-192705 A | 8/2008 | |
| JP | 2012-059836 A | 3/2012 | |
| JP | 2013-089867 A | 5/2013 | |
| JP | 2013-127092 A | 6/2013 | |
| JP | 2013-214566 A | 10/2013 | |
| WO | 03/090277 A1 | 10/2003 | |

OTHER PUBLICATIONS

Machine translation into English of JP 2008-108993A; Kitahara et al, May 2008.*
International Search Report dated Aug. 18, 2015, issued for PCT/JP2015/068297 and English translation thereof.
Office Action dated Aug. 10, 2018, issued for the Taiwanese patent application No. 104120553 and English translation thereof.
Search Report dated Jan. 31, 2018, issued for the European patent application No. 15815813.9.

* cited by examiner

*Primary Examiner* — Karuna P Reddy
(74) *Attorney, Agent, or Firm* — Locke Lord LLP (57) ABSTRACT

A method for producing a ceramic-aluminum bonded body obtained by bonding a ceramic member and an aluminum member, the aluminum member before bonding being composed of aluminum having a purity of 99.0 mass % or higher and 99.9 mass % or lower, includes a heat treatment step of subjecting the aluminum member to a heat treatment in a range of 400° C. or higher and lower than a solidus temperature, and a bonding step of bonding the aluminum member after the heat treatment step and the ceramic member via a brazing filler material including Si.

5 Claims, 6 Drawing Sheets

METHOD FOR PRODUCING CERAMIC-ALUMINUM BONDED BODY, METHOD FOR PRODUCING POWER MODULE SUBSTRATE, CERAMIC-ALUMINUM BONDED BODY, AND POWER MODULE SUBSTRATE

TECHNICAL FIELD

The present invention relates to a method for producing a ceramic-aluminum bonded body obtained by bonding a ceramic member and an aluminum member, a method for producing a power module substrate including a ceramic substrate and an aluminum plate that is bonded to the ceramic substrate, a ceramic-aluminum bonded body, and a power module substrate.

Priority is claimed on Japanese Patent Application No. 2014-134572, filed Jun. 30, 2014, the content of which is incorporated herein by reference.

BACKGROUND ART

A semiconductor device such as an LED or a power module has a structure in which semiconductor elements are bonded onto a circuit layer made of a conductive material.

In a power semiconductor element for high power control used to control wind power generation, an electric automobile, a hybrid automobile, and the like, a large amount of heat is generated. Thus, as a substrate for mounting the power semiconductor element thereon, for example, a power module substrate including a ceramic substrate made of aluminum nitride (AlN), alumina ($Al_2O_3$), and the like and a circuit layer formed by bonding a metal plate having excellent conductivity to one surface of the ceramic substrate has been conventionally widely used. As the power module substrate, a power module substrate in which a metal layer is formed by bonding a metal plate to the other surface of the ceramic substrate has also been provided.

For example, PTL 1 proposes a power module substrate obtained by bonding an aluminum plate, which becomes a circuit layer, to one surface of a ceramic substrate made of aluminum nitride (AlN) via an Al—Si-based brazing filler material and bonding an aluminum plate, which becomes a metal layer, to the other surface of the ceramic substrate via an Al—Si-based brazing filler material.

Such a power module substrate is configured such that a semiconductor element as a power element is mounted on the circuit layer via a solder layer and is used as a power module. In addition, a heat sink made of copper may be bonded to the metal layer side via solder.

When the above-described power module is used, there is the burden of a heat cycle. At this time, stress caused by the difference in the thermal expansion coefficient between the ceramic substrate and the aluminum plate is applied to the bonding interfaces between the ceramic substrate and the circuit layer and the metal layer, and thus there is a concern of the bonding reliability deteriorating. Conventionally, a circuit layer and a metal layer are composed of aluminum having a purity of 99.99 mass % or higher (so-called 4N aluminum) or the like and thermal stress is absorbed via the deformation of the circuit layer and the metal layer so that bonding reliability is improved.

In the case in which the circuit layer and the metal layer are composed of aluminum having a purity of 99.99 mass % or higher (4N aluminum) or the like and having a relatively weak deformation resistance, when loading a thermal cycle, there arises a problem of waviness or wrinkles occurring on the surfaces of the circuit layer and the metal layer. When waviness or wrinkles occur on the surfaces of the circuit layer and the metal layer as described above, cracks may be formed in the solder layer, and thus the reliability of the power module may deteriorate.

Particularly, in recent years, from the viewpoint of an environmental load, Sn—Ag-based and Sn—Cu-based lead-free solder materials have been frequently used for a solder layer. Since these lead-free solder materials have strong deformation resistance compared to conventional Sn—Pb-based solder materials, cracks are likely to be formed in the solder layer due to waviness or wrinkles occurring on the circuit layer and the metal layer.

In addition, in recent years, since the application environments of power modules have become harsher and the amount of heat generated from electronic components such as a semiconductor element has become greater, temperature differences in a heat cycle have become greater, and waviness or wrinkles are likely to occur on the surfaces of the circuit layer and the metal layer.

For example, PTL 2 proposes a power module substrate in which waviness or wrinkles on the surface of the circuit layer are prevented by forming a circuit layer using a precipitation dispersion type aluminum alloy.

Further, PTL 3 proposes a power module substrate in which plastic deformation of a metal layer is prevented by adding additive elements to aluminum constituting the metal layer.

CITATION LIST

Patent Literature

[PTL 1] PCT International Publication No. WO03/090277
[PTL 2] Japanese Unexamined Patent Application, First Publication No. 2012-059836
[PTL 3] Japanese Unexamined Patent Application, First Publication No. 2008-108993

DISCLOSURE OF INVENTION

Technical Problem

However, in recent years, a power module has been reduced in size and thickness, and a circuit layer and a metal layer have also been reduced in thickness. When the thickness of the aluminum plate constituting the circuit layer and the metal layer is reduced, at the time of bonding the ceramic substrate and the aluminum plate, Si in an Al—Si-based brazing filler material diffuses into the aluminum plate and reaches the surface on the opposite side from the ceramic substrate, thereby causing surface alteration. In addition, in the case in which Si in the Al—Si-based brazing filler material diffuses into the aluminum plate to cause surface alteration, an insufficient liquid phase is formed at the bonding interface between the ceramic substrate and the aluminum plate, and thus there is a concern that the ceramic substrate and the aluminum plate may not be bonded.

The present invention is made in consideration of the above-described circumstances and an object of the present invention is to provide a method for producing a ceramic-aluminum bonded body capable of preventing, when a ceramic member and an aluminum member are bonded using a brazing filler material including Si, Si from diffusing to the surface of the aluminum member on the opposite side from the surface bonded to the ceramic member and reliably bonding the ceramic member and the aluminum member, a method for producing a power module substrate, a ceramic-aluminum bonded body, and a power module substrate.

Solution to Problem

In order to achieve the above object by solving such problems, as a result of intensive investigations conducted by the inventors, it has been found that Si in the brazing filler material diffuses into the aluminum member along the crystal grain boundaries of the aluminum member and reaches the surface of the aluminum member on the opposite side from the ceramic member, the melting point of the surface of the aluminum member locally decreases, and thus the surface melts to cause surface alteration.

The present invention is made based on the above findings. According to an aspect of the present invention, a method is provided for producing a ceramic-aluminum bonded body obtained by bonding a ceramic member and an aluminum member, the aluminum member before bonding being composed of aluminum having a purity of 99.0 mass % or higher and 99.9 mass % or lower, said method including: a heat treatment step of subjecting the aluminum member to a heat treatment in a range of 400° C. or higher and lower than a solidus temperature, and a bonding step of bonding the aluminum member after the heat treatment step and the ceramic member via a brazing filler material including Si.

In the method for producing a ceramic-aluminum bonded body having such a configuration, since the aluminum member composed of aluminum having a purity of 99.0 mass % or higher and 99.9 mass % or lower is subjected to a heat treatment in a range of 400° C. or higher and lower than a solidus temperature before the aluminum member is bonded to the ceramic member, large crystal grains of the aluminum member before bonding can be produced. Accordingly, when the ceramic member and the aluminum member are bonded, Si in the brazing filler material can be prevented from diffusing along the crystal grain boundaries. Thus, a sufficient liquid phase can be formed between the aluminum member and the ceramic member, and thus the ceramic member and the aluminum member can be reliably bonded. In addition, Si can be prevented from diffusing to the surface of the aluminum member and the surface alteration of the aluminum member can be prevented.

When the crystal grains of the aluminum member are coarsened before the brazing filler material melts at the time of heating in the bonding step without coarsening the crystal grains of the aluminum member via complete recrystallization in the heat treatment step, Si diffusion can be prevented.

According to another aspect of the present invention, a method is provided for producing a power module substrate which includes a ceramic substrate and an aluminum plate that is bonded to the ceramic substrate, the aluminum plate before bonding being composed of aluminum having a purity of 99.0 mass % or higher and 99.9 mass % or lower, said method including: bonding the aluminum plate and the ceramic substrate by the above-described method for producing a ceramic-aluminum bonded body.

In the power module substrate, a circuit layer or a metal layer are formed by bonding an aluminum plate of aluminum having a purity of 99.0 mass % or higher and 99.9 mass % or lower to one surface or the other surface of the ceramic substrate. The aluminum plate of aluminum having a purity of 99.0 mass % or higher and 99.9 mass % or lower, which constitutes the circuit layer or the metal layer, is bonded to the ceramic substrate by the above-described method for producing a ceramic-aluminum bonded body. Thus, Si diffusion is prevented, a sufficient liquid phase between the aluminum plate and the ceramic substrate can be formed, and therefore, the circuit layer or the metal layer and the ceramic substrate can be reliably bonded. In addition, Si can be prevented from diffusing to the surface of the aluminum plate on the opposite side from the ceramic substrate and the surface alteration of the circuit layer or the metal layer can be prevented.

According to still another aspect of the present invention, a ceramic-aluminum bonded body is provided which is obtained by bonding a ceramic member and an aluminum member, in which the aluminum member before bonding is composed of aluminum having a purity of 99.0 mass % or higher and 99.9 mass % or lower, and a grain boundary length L, which is observed in a section of the aluminum member after bonding in a thickness direction, per $mm^2$ is 0.1 mm or less.

According to the ceramic-aluminum bonded body having such a configuration, the grain boundary length L, which is observed in the section of the aluminum member after bonding in the thickness direction, per $mm^2$ is 0.1 mm or less. Therefore, it is possible to provide a high quality ceramic-aluminum bonded body in which Si diffusion along the grain boundaries is prevented, surface alteration of the aluminum member is prevented, and the ceramic member and the aluminum member are reliably bonded.

According to still another aspect of the present invention, a power module substrate is provided including a ceramic substrate and an aluminum plate that is bonded to the ceramic substrate, in which the aluminum plate before bonding is composed of aluminum having a purity of 99.0 mass % or higher and 99.9 mass % or lower, and a grain boundary length L, which is observed in a section of the aluminum plate after bonding in a thickness direction, per $mm^2$ is 0.1 mm or less.

According to the power module substrate having such a configuration, the grain boundary length L, which is observed in the section of a circuit layer or a metal layer that is formed by bonding the aluminum plate of aluminum having a purity of 99.0 mass % or higher and 99.9 mass % or lower to one surface or the other surface of the ceramic substrate in the thickness direction, per $mm^2$ is 0.1 mm or less. Therefore, it is possible to provide a high quality power module substrate in which Si diffusion to the grain boundaries is prevented, surface alteration of the circuit layer or the metal layer is prevented, and the ceramic substrate and the circuit layer or the metal layer are reliably bonded.

In the power module substrate according to the aspect of the present invention, the thickness of the aluminum plate may be in a range of 0.05 mm or more and less than 0.4 mm.

According to the power module substrate having such a configuration, even in the case in which the thickness of the aluminum plate constituting the circuit layer or the metal layer is as relatively small as 0.05 mm or more and less than 0.4 mm, Si can be prevented from diffusing to the surface of the circuit layer or the metal layer on the opposite side from the ceramic substrate and surface alteration can be prevented.

ADVANTAGEOUS EFFECTS OF INVENTION

According to the present invention, it is possible to provide a method for producing a ceramic-aluminum bonded body capable of preventing, when a ceramic member and an aluminum member are bonded using a brazing filler material including Si, Si from diffusing to the surface of the aluminum member on the opposite side from the surface bonded to the ceramic member and reliably bonding the ceramic member and the aluminum member, a method for producing a power module substrate, a ceramic-aluminum bonded body, and a power module substrate.

BEST MODE FOR CARRYING OUT THE INVENTION

Hereinafter, embodiments of the present invention will be described with reference to the accompanying drawings. A ceramic-aluminum bonded body of an embodiment is formed into a power module substrate 10 including a ceramic substrate 11 as a ceramic member, a circuit layer 12 obtained by bonding an aluminum plate 22 as an aluminum member to the ceramic substrate 11, and a metal layer 13 obtained by bonding an aluminum plate 23 to the ceramic substrate 11.

Figure 1:
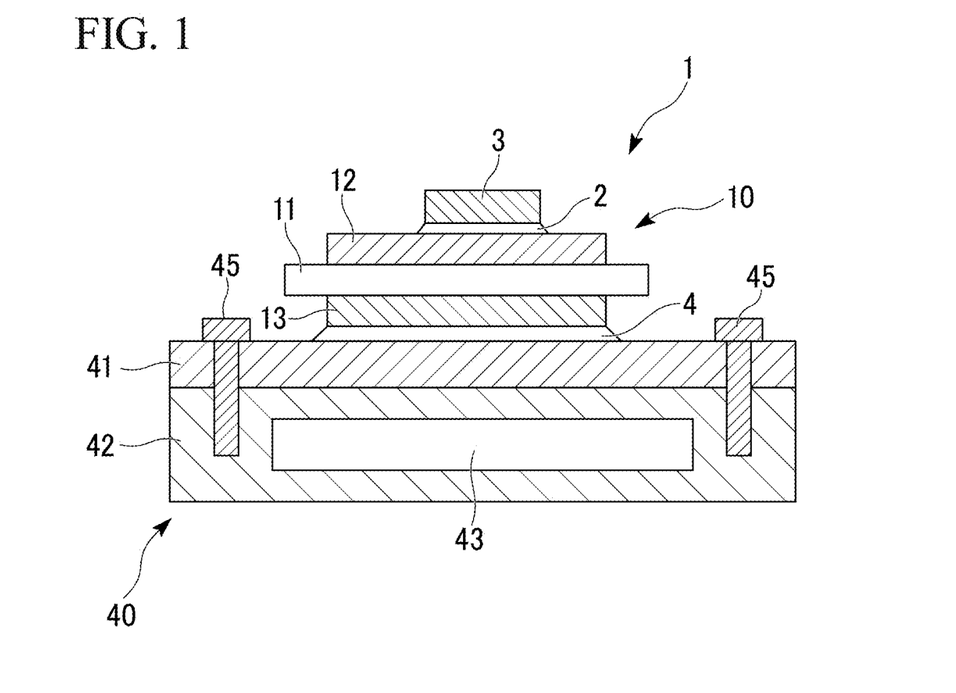
FIG. 1 is a schematic explanatory view of a power module using a power module substrate according to an embodiment of the present invention.

FIG. 1 shows a power module 1 using a power module substrate 10 according to an embodiment of the present invention.

The power module 1 includes the power module substrate 10 in which the circuit layer 12 and the metal layer 13 are arranged, a semiconductor element 3 which is bonded to one surface of the circuit layer 12 (the upper surface in FIG. 1) through a first solder layer 2, and a heat sink 40 which is bonded to the other surface of the metal layer 13 (the lower surface in FIG. 1) through a second solder layer 4.

The first solder layer 2 and the second solder layer 4 are formed of, for example, a Sn—Ag-based, Sn—In-based, or Sn—Ag—Cu-based solder material. In the embodiment, a Ni plating layer (not shown) is provided between the circuit layer 12 and the first solder layer 2, and between the metal layer 13 and the second solder layer 4.

The power module substrate 10 includes the ceramic substrate 11, the circuit layer 12 which is arranged on one surface of the ceramic substrate 11 (the upper surface in FIG. 1), and the metal layer 13 which is arranged on the other surface of the ceramic substrate 11 (the lower surface in FIG. 1).

Figure 3:
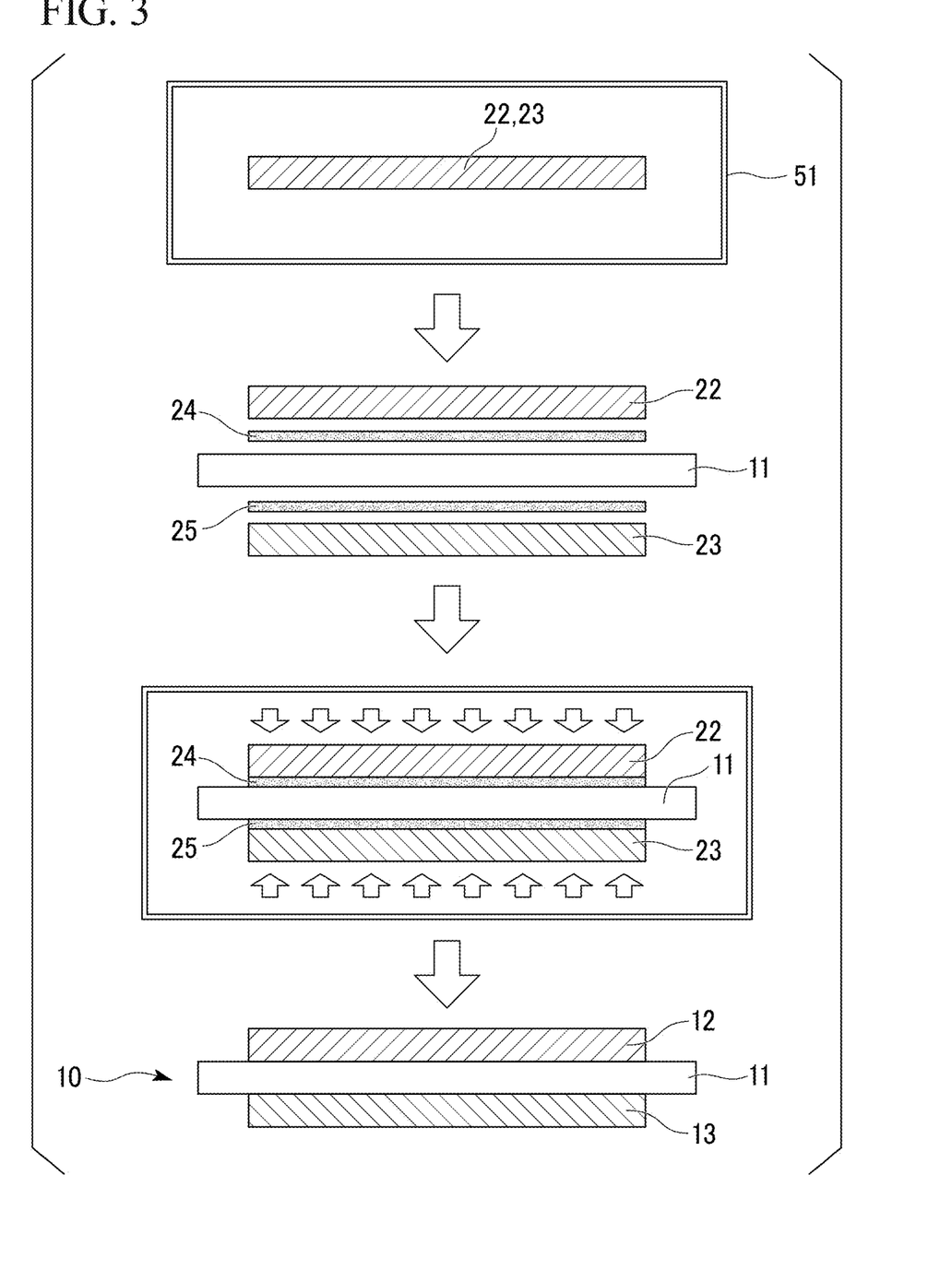
FIG. 3 is an explanatory view showing the method for producing the power module substrate according to the embodiment of the present invention.

The ceramic substrate 11 is provided to prevent electric connection between the circuit layer 12 and the metal layer 13 and is composed of aluminum nitride (AlN) having high insulation properties in the embodiment. In addition, the thickness of the ceramic substrate 11 is set to be in a range of 0.2 to 1.5 mm, and the thickness thereof in the embodiment is set to 0.635 mm. In the embodiment, as shown in FIGS. 1 and 3, the width of the ceramic substrate 11 is set to be wider than the width of the circuit layer 12 and the metal layer 13.

The circuit layer 12 is formed by bonding a metal plate having conductivity to one surface of the ceramic substrate 11. In the embodiment, as shown in FIG. 3, the circuit layer 12 is formed by bonding the aluminum plate 22 made of a rolled sheet of aluminum having a purity of 99.0 mass % or higher and 99.9 mass % or lower to the ceramic substrate 11. In the embodiment, an aluminum plate of A1050 (having a purity of 99.5%) is used.

A circuit pattern is formed on the circuit layer 12 and one surface thereof (the upper surface in FIG. 1) is a mounting surface on which the semiconductor element 3 is mounted. The thickness of the circuit layer 12 (aluminum plate 22) is set to be in a range of 0.05 mm or more and less than 0.4 mm and the thickness thereof in the embodiment is set to 0.3 mm. The thickness of the circuit layer 12 is preferably 0.2 mm or more and less than 0.4 mm, but is not limited to this range.

The metal layer 13 is formed by bonding a metal plate having excellent thermal conductivity to the other surface of the ceramic substrate 11. In the embodiment, as shown in FIG. 3, the metal layer 13 is formed by bonding the aluminum plate 23 made of a rolled sheet of aluminum having a purity of 99.0 mass % or higher and 99.9 mass % or lower to the ceramic substrate 11. In the embodiment, an aluminum plate of A1050 (having a purity of 99.5%) is used.

The thickness of the metal layer 13 (aluminum plate 23) is set to be in a range of 0.05 mm or more and less than 0.4 mm and the thickness thereof in the embodiment is set to 0.3 mm. The thickness of the metal layer 13 is preferably 0.2 mm or more and less than 0.4 mm, but is not limited to this range.

The heat sink 40 is provided to cool the above-described power module substrate 10 and includes a heat dissipation plate 41 to be bonded to the power module substrate 10 and a cooler 42 which is arranged on the heat dissipation plate 41 in a laminated manner.

The heat dissipation plate 41 is provided to dissipate heat from the above-described power module substrate 10 in an in-plane direction and is formed of a copper having excellent thermal conductivity in the embodiment.

The cooler 42 includes a flow passage 43 via which a cooling medium (for example, cooling water) flows as shown in FIG. 1. The cooler 42 is desirably composed of a material having good thermal conductivity and is composed of A6063 (aluminum alloy) in the embodiment.

As shown in FIG. 1, the heat dissipation plate 41 and the cooler 42 are fastened together with a fixing screw 45.

In the embodiment, a grain boundary length L, which is observed in the section of the circuit layer 12 and the metal layer 13 in the thickness direction, per $mm^2$ is set to 0.1 mm or less.

The grain boundary length L in the circuit layer 12 and the metal layer 13 can be measured by the following procedure.

First, using an EBSD measuring apparatus, the crystal grain size in the section of the circuit layer 12 and the metal layer 13 is measured and whether crystal grains having a size of 80% or more of the thickness of the circuit layer 12 and the metal layer 13 are present is investigated (for example, in the case in which thickness of the circuit layer 12 and the metal layer 13 is 0.2 mm, whether crystal grains having a size of 160 µm or more are present is investigated).

In the case in which crystal grains having a size of 80% or more of the thickness of the circuit layer 12 and the metal layer 13 are not present, in a range of a horizontal width direction: 0.38 mm and a thickness direction: 80% of the thickness of the circuit layer 12 and the metal layer 13 (for example, in the case in which the thickness of the circuit layer 12 and the metal layer 13 is 0.2 mm, 0.16 mm) in the section of the circuit layer 12 and the metal layer 13, a total length of high angle grain boundaries (at an inclination of 15 degrees to 180 degrees) is calculated using analysis software of an EBSD measuring apparatus. Then, the total length of the high angle grain boundaries is divided by the measured area to calculate a grain boundary length L per mm$^2$.

Figure 4:
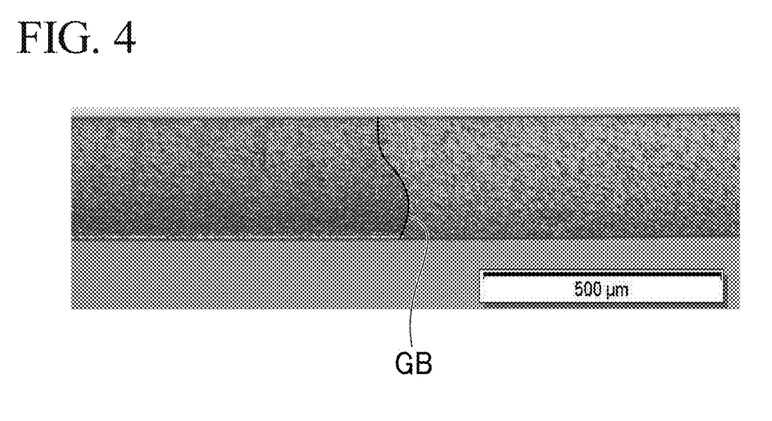
FIG. 4 is an image showing a result of observing the section of a circuit layer and a metal layer in the case in which coarse crystal grains having a grain size of 80% or more of the thickness of the circuit layer and the metal layer are present.

On the other hand, in the case in which coarse crystal grains having a grain size of 80% or more of the thickness of the circuit layer 12 and the metal layer 13 are present, as shown in FIG. 4, the grain boundary observed in the surface of the circuit layer 12 or the metal layer 13 extends so as to reach the interface with the ceramic substrate 11.

Three straight lines are drawn on the surface of the circuit layer 12 or the metal layer 13 in vertical and horizontal directions respectively, a grain boundary having a length the same as the thickness of the circuit layer 12 or the metal layer 13 is considered to be present in a place where the straight line intersects the grain boundary, in the thickness direction of the circuit layer 12 or the metal layer 13, and the grain boundary length L per mm$^2$ in the section is calculated. The shorter the grain boundary length L per mm$^2$ in the section of the circuit layer 12 or the metal layer 13 is, the more preferable it is. However, setting the grain boundary length L per mm$^2$ in the section to be extremely short causes an increase in costs. Therefore, the grain boundary length L per mm$^2$ in the section may be 0.01 mm or more. In addition, the grain boundary length L per mm$^2$ in the section is preferably 0.05 mm or less but is not limited thereto.

Next, a method for producing the power module substrate 10 according to the above-described embodiment will be described with reference to FIGS. 2 and 3.

(Heat Treatment Step S01)

Figure 2:
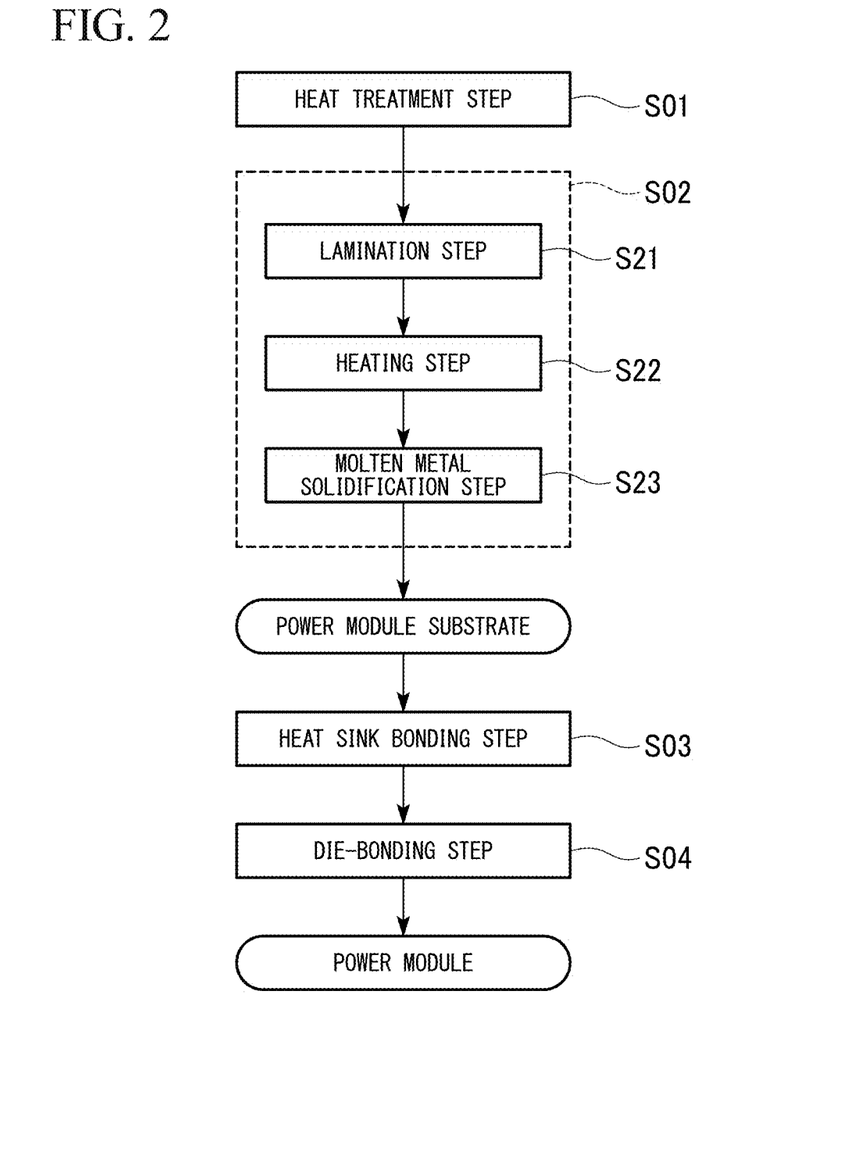
FIG. 2 is a flowchart showing a method for producing the power module substrate according to the embodiment of the present invention.

First, as shown in FIGS. 2 and 3, the aluminum plates 22 and 23 before being bonded to the ceramic substrate 11 are subjected to a heat treatment in a range of a heat treatment temperature of 400° C. or higher and lower than the solidus temperature.

Figure 5:
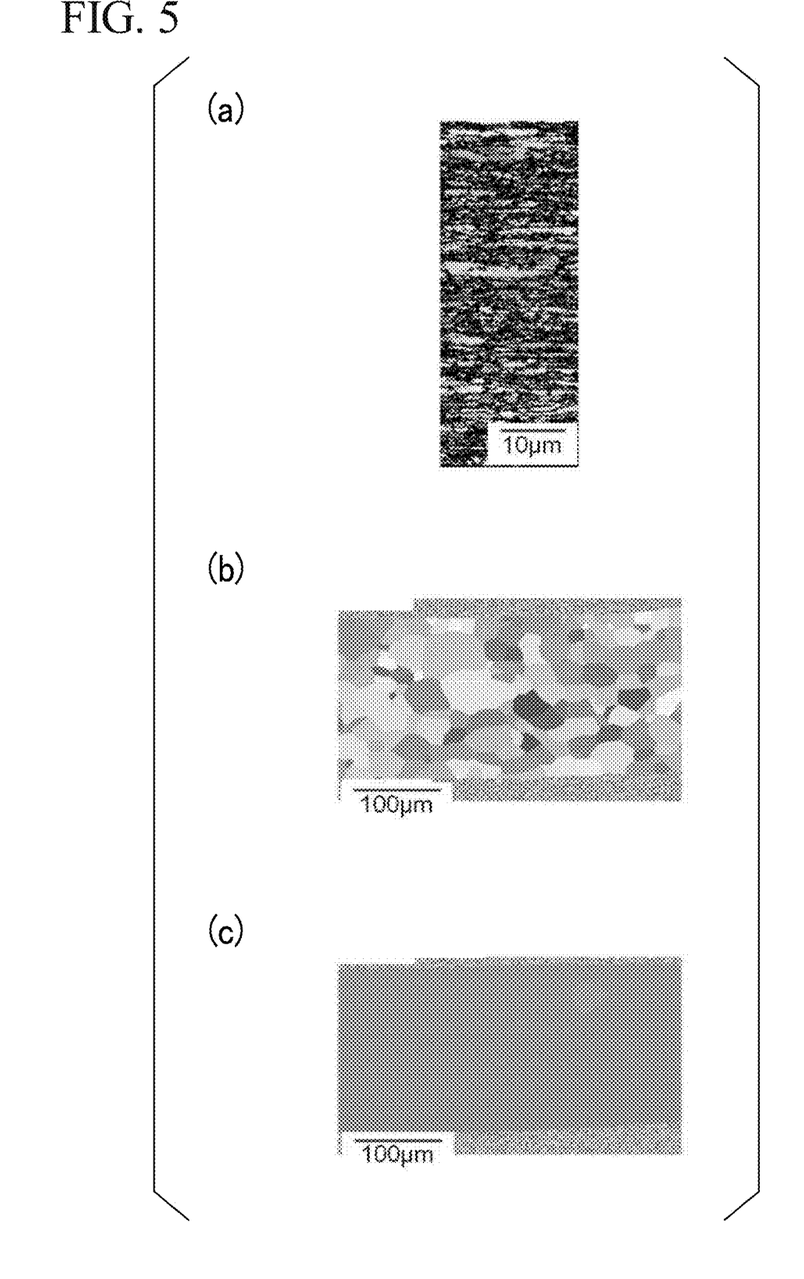
FIG. 5 shows views of results of observing aluminum plates used in Examples, (a) shows an aluminum plate before a heat treatment used in Conventional Example, (b) shows an aluminum plate after the heat treatment used in Example 9, and (c) shows an aluminum plate after the heat treatment used in Example 10.

In the embodiment, a vacuum heating furnace 51 is used under the conditions that the atmosphere is set to a vacuum atmosphere (for example, 10$^{-4}$ Pa or higher and 10$^{-3}$ Pa or lower) and the holding time at the above heat treatment temperature is set in a range of 20 minutes or longer and 35 minutes or shorter. Via the heat treatment step S01, the crystal grains of the aluminum plates 22 and 23 grow via recrystallization and are coarsened as shown in FIG. 5. The aluminum plates 22 and 23 are cooled to room temperature by furnace cooling, flow using an inert gas such as N$_2$ or Ar, or the like.

In the case in which the heat treatment temperature is lower than 400° C., there is a concern that the crystal grains of the aluminum plates 22 and 23 are not recrystallized, and thus sufficiently large crystals cannot be produced. On the other hand, in the case in which the heat treatment temperature is equal to or higher than the solidus temperature, the aluminum plates 22 and 23 themselves may melt. In the embodiment, the heat treatment temperature in the heat treatment step S01 is set to be in a range of 400° C. or higher and lower than the solidus temperature. In order to coarsen the crystal grains by reliably recrystallizing the crystals of the aluminum plates 22 and 23, the heat treatment temperature is preferably 400° C. or higher and more preferably 500° C. or higher. In addition, the heat treatment temperature is preferably 645° C. or lower.

(Bonding Step S02)

Next, the aluminum plates 22 and 23 which have been subjected to the heat treatment step S01 are bonded to the ceramic substrate 11 to form the circuit layer 12 and the metal layer 13.

In the embodiment, as shown in FIG. 2, the bonding step S02 includes a lamination step S21, a heating step S22, and a molten metal solidification step S23.

In the lamination step S21, as shown in FIG. 3, the aluminum plate 22 which has been subjected to the heat treatment step S01 is laminated on one surface of the ceramic substrate 11 via a brazing filler material 24 including Si. In addition, the aluminum plate 23 which has been subjected to the heat treatment step S01 is laminated on the other surface of the ceramic substrate 11 via a brazing filler material 25 including Si. As the brazing filler materials 24 and 25, Al—Si-based, Al—Si—Mg-based, Al—Cu—Si-based, and 4000-series aluminum alloys can be used.

In the embodiment, as the brazing filler materials 24 and 25, an Al—Si-based brazing filler material foil or a brazing filler material paste containing Si in a range of 6.0 mass % or more and 12 mass % or less is used and the thickness of the brazing filler materials 24 and 25 is set to be in a range of 5 µm or more and 30 µm or less.

In the heating step S22, the aluminum plate 22, the brazing filler material 24, the ceramic substrate 11, the brazing filler material 25, and the aluminum plate 23, which are laminated as described above, are put into a heating furnace 52 and heated in a state in which the laminate is pressed in the lamination direction (with a pressure of 1 to 5 kgf/cm$^2$ (0.10 to 0.49 MPa)). Parts of the brazing filler materials 24 and 25 and the aluminum plates 22 and 23 melt and a molten metal region is formed at each interface between the aluminum plate 22 and the ceramic substrate 11 and the aluminum plate 23 and the ceramic substrate 11. The atmosphere is a vacuum atmosphere (10$^{-4}$ Pa or higher and 10$^{-3}$ Pa or lower), the heating temperature is set to be in a range of 550° C. or higher and 650° C. or less, and the heating time is set to be in a range of 30 minutes or longer and 180 minutes or shorter.

In the heating step S22, the crystal grains of the aluminum plates 22 and 23 are recrystallized before the brazing filler materials 24 and 25 melt, and thus the crystal grains are coarsened. At this time, the grain boundary length L of the aluminum plates 22 and 23, which is observed in the section in the thickness direction, per mm$^2$ is 0.1 mm or less.

In the molten metal solidification step S23, by solidifying the molten metal region formed at each interfaces between the aluminum plates 22 and 23 and the ceramic substrate 11, the aluminum plate 22 and the aluminum plate 23 are bonded to the ceramic substrate 11.

Thus, a power module substrate 10 in which the circuit layer 12 and the metal layer 13 are formed on the ceramic substrate 11 is produced.

(Heat Sink Bonding Step S03)

Next, the heat dissipation plate 41 is bonded to the other surface of the metal layer 13 of the power module substrate 10 via the second solder layer 4, and the heat dissipation plate 41 is fastened to the cooler 42 with a fixing screw 45. Thus, the heat sink 40 and the power module substrate 10 are bonded.

(Die-bonding Step S04)

In addition, the semiconductor element 3 is bonded to one surface of the circuit layer 12 via the first solder layer 2. Thus, a power module 1 which is the embodiment is produced.

In the method for producing the power module substrate 10 having the above-described configuration according to the embodiment, since the heat treatment step S01 of subjecting the aluminum plates 22 and 23 to a heat treatment in a range of 400° C. or higher and lower than a solidus temperature before the bonding step S02 of bonding the aluminum plates 22 and 23 composed of aluminum having a purity of 99.0 mass % or higher and 99.9 mass % or lower to the ceramic substrate 11 to form the circuit layer 12 and the metal layer 13, even when the aluminum plates 22 and 23 composed of aluminum having a purity of 99.0 mass % or higher and 99.9 mass % or lower are used, the crystal grains of the aluminum plates 22 and 23 are recrystallized, and thus large crystal grains can be produced.

Thus, even in the case in which the brazing filler materials 24 and 25 melt to form molten metal regions in the bonding step S02, Si in the brazing filler materials 24 and 25 can be prevented from diffusing along the crystal grain boundaries of the aluminum plates 22 and 23. Thus, Si in the brazing filler materials 24 and 25 can be prevented from diffusing to the side of the aluminum plates 22 and 23 on the opposite side from the surface bonded to the ceramic substrate 11, and thus the surface alteration of the aluminum plates 22 and 23 (the circuit layer 12 and the metal layer 13) after bonding can be prevented.

In addition, a molten metal region can be sufficiently formed at the bonding interfaces between the ceramic substrate 11 and the aluminum plates 22 and 23 by preventing Si from diffusing, and thus the ceramic substrate 11 and the aluminum plates 22 and 23 (the circuit layer 12 and the metal layer 13) can be firmly bonded.

In the embodiment, in the heating step S22 of the bonding step S02, it is sufficient that the crystal grains of the aluminum plates 22 and 23 be recrystallized before the brazing filler materials 24 and 25 melt and the crystal grains are coarsened. Thus, it is not required that the crystal grains of the aluminum plates 22 and 23 be completely recrystallized to coarsen the crystal grains in the heat treatment step S01. The crystal grains of the aluminum plates 22 and 23 may be completely recrystallized in the heat treatment step S01. For example, recrystallization occurs rapidly in the aluminum plates 22 and 23 made of A1050, at a heat treatment temperature in a range of 560° C. to 580° C., and thus when the heat treatment temperature is set to 580° C. or higher, the crystal grains of the aluminum plates 22 and 23 are completely recrystallized.

Further, since the power module substrate 10 according to the embodiment is produced in such a manner that the aluminum plates 22 and 23 composed of aluminum having a purity of 99.0 mass % or higher and 99.9 mass % or lower are subjected to a heat treatment to coarsen the crystal grains, and then the aluminum plates are bonded to the ceramic substrate 11 as described above, the crystal grains of the circuit layer 12 and the metal layer 13 are coarsened.

Specifically, the grain boundary length L, which is observed in the section of the circuit layer 12 and the metal layer 13 (the aluminum plates 22 and 23 after bonding) in the thickness direction, per mm$^2$ is 0.1 mm or less. Thus, Si diffusion to the grain boundaries is prevented, the surface alteration of the aluminum plates 22 and 23 is prevented, and thus excellent surface quality is obtained.

In addition, a molten metal region is reliably formed at the bonding interfaces between the ceramic substrate 11 and the aluminum plates 22 and 23 and the ceramic substrate 11, and the circuit layer 12 and the metal layer 13 (aluminum plates 22 and 23) are reliably bonded. Thus, excellent bonding reliability is achieved.

Although the embodiments of the present invention have been described above, the present invention is not limited thereto and can be appropriately changed within the range not departing the technical idea of the present invention.

For example, the power module substrate in the embodiment has been described as an example. However, the present invention is not limited thereto and may be a ceramic-aluminum bonded body obtained by bonding the ceramic member and the aluminum member composed of aluminum having a purity of 99.0 mass % or higher and 99.9 mass % or lower.

In addition, in the embodiment, the circuit layer and the metal layer are formed by bonding the aluminum plates of aluminum having a purity of 99.0 mass % or higher and 99.9 mass % or lower to both sides of the ceramic substrate. However, there is no limitation thereto. Either the circuit layer or the metal layer may be composed of an aluminum plate of aluminum having a purity of 99.0 mass % or higher and 99.9 mass % or lower.

Specifically, in the case in which the metal layer is composed of an aluminum plate of aluminum having a purity of 99.0 mass % or higher and 99.9 mass % or lower, the circuit layer may be composed of an aluminum plate of 4N aluminum having a purity of 99.99 mass % or higher, a copper plate made of copper or a copper alloy, a laminated plate of aluminum and copper, or the like. In addition, in the case in which the circuit layer is composed of an aluminum plate of aluminum having a purity of 99.0 mass % or higher and 99.9 mass % or lower, the metal layer may be composed of other metals such as an aluminum plate of 4N aluminum having a purity of 99.99 mass % or higher and composite materials, and the metal layer itself may not be formed.

In the embodiment, for example, a ceramic substrate made of aluminum nitride (AlN) is used as the ceramic substrate 11. However, there is no limitation thereto. The ceramic substrate may be composed of other ceramics such as alumina ($Al_2O_3$) and silicon nitride ($Si_3N_4$).

Further, the Ni plating layer is formed on the surfaces of the circuit layer and the metal layer on which solder bonding is carried out. However, there is no limitation thereto. An underlayer may be composed of other means such as an Ag paste.

In addition, the heat sink is not limited to the embodiment shown as an example and the structure of the heat sink is not particularly limited.

EXAMPLES

A confirmation test carried out to confirm the effectiveness of the present invention will be described.

A rolled plate (70 mm×70 mm×thickness 0.4 mm) of aluminum having a purity of 99.99 mass % (4N aluminum) was prepared as an aluminum plate for constituting a circuit layer.

In addition, a ceramic substrate (72 mm×70 mm×thickness 0.635 mm) made of AlN was prepared.

A rolled plate (72 mm×70 mm) having a composition and a thickness shown in Table 1 was prepared as an aluminum plate for constituting a metal layer.

The aluminum plate for constituting the metal layer was subjected to a heat treatment under a vacuum ($1 \times 10^{-3}$ Pa) atmosphere and the conditions shown in Table 1. The temperature rising rate was set to 20° C./min, and after the plate was kept at each heat treatment temperature, the plate was cooled by $N_2$ flow.

In Conventional Example, an aluminum plate was not subjected to a heat treatment.

The rolled plate of 4N aluminum, the ceramic substrate, and the aluminum plate after the heat treatment were bonded using an Al—Si-based brazing filler material (Al-7.5 mass % Si, thickness: 17 µm) to produce a power module substrate.

Specifically, the laminate was pressed with a load of 3 kgf/cm² (0.29 MPa) in the lamination direction under a vacuum (1×10⁻³ Pa) atmosphere, heated at 650° C., held for 30 min and then cooled by $N_2$ flow.

(Crystal Grain Size of Aluminum Plate After Heat Treatment)

The aluminum plate for constituting the metal layer was subjected to a heat treatment and then the crystal grain size of the aluminum plate was measured. The measurement results are shown in Table 1. The method for measuring the crystal grain size was carried out as follows. First, the section of the aluminum plate was observed using an EBSD measuring apparatus (Quanta FEG 450, manufactured by FEI Company), and in a range of the horizontal width direction: 0.38 mm and the thickness direction: 80% of the thickness of the metal layer (for example, in the case in which the thickness of the metal layer is 0.2 mm, 0.16 mm), the areas of portions (crystal grains) surrounded by grain boundaries were calculate. Then, a total of the areas was divided by the number of crystal grains and the average area of crystal grains in the range was calculated. Thus, the diameter of a circle having the same area as the average area was set to a crystal grain size. The grain boundary was set to a high angle grain boundary (at an inclination of 15 degrees to 180 degrees).

The observation results of the crystal grains of the aluminum plate (without conducting a heat treatment) used in Conventional Example and the aluminum plates after the heat treatment used in Examples 9 and 10 are shown in FIG. 5.

(Surface Alteration of Metal Layer)

The surface of the metal layer on the opposite side from the ceramic substrate (metal layer surface) in the power module substrate after bonding was visually and the surface alteration occurrence state was evaluated based on the following criteria.

A: Surface alteration was not observed.

B: Surface alteration was observed and the surface alteration occurred in a range of less than 30% of the surface area of the metal layer.

C: Surface alteration was observed and the surface alteration occurred in a range 30% or more of the surface area of the metal layer.

(Bonding Rate of Metal Layer and Ceramic Substrate)

The bonding rate of the metal layer and the ceramic substrate was obtained from the following equation using an ultrasonic image diagnostic apparatus (INSIGHT-300, manufactured by Insight K.K). The initial bonding area refers to an area to be bonded before bonding and was set to the area of the metal layer (72 mm×70 mm). A peeled portion of an image obtained by subjecting an ultrasonic flaw detection image to binarization processing showed as white in the bonded portion, and thus the area of this white portion was set as a peeled area.

(Bonding rate (%))={(Initial bonding area)−(Peeled area)}/(Initial bonding area)×100

(Grain Boundary Length L of Metal Layer)

The section of the metal layer in the thickness direction was observed to measure the grain boundary length L per mm². The measurement results are shown in Table 1.

The measurement method was as follows. First, using an EBSD measuring apparatus, whether crystal grains having a grain size of 80% or more of the thickness of the metal layer are present in the section of the metal layer was investigated (for example, in the case in which the thickness of the circuit layer 12 and the metal layer 13 is 0.2 mm, whether crystal grains having a grain size of 160 µm or more are present was investigated).

In the case in which coarse crystal grains having grain size of 80% or more of the thickness of the metal layer are not present, in a range of a horizontal width direction: 0.38 mm and a thickness direction: 80% of the thickness of the metal layer, a total length of high angle grain boundaries (at an inclination of 15 degrees to 180 degrees) was calculated using analysis software of an EBSD measuring apparatus. Then, the total length of the high angle grain boundaries was divided by the measured area to calculate a grain boundary length L per mm².

Figure 6:
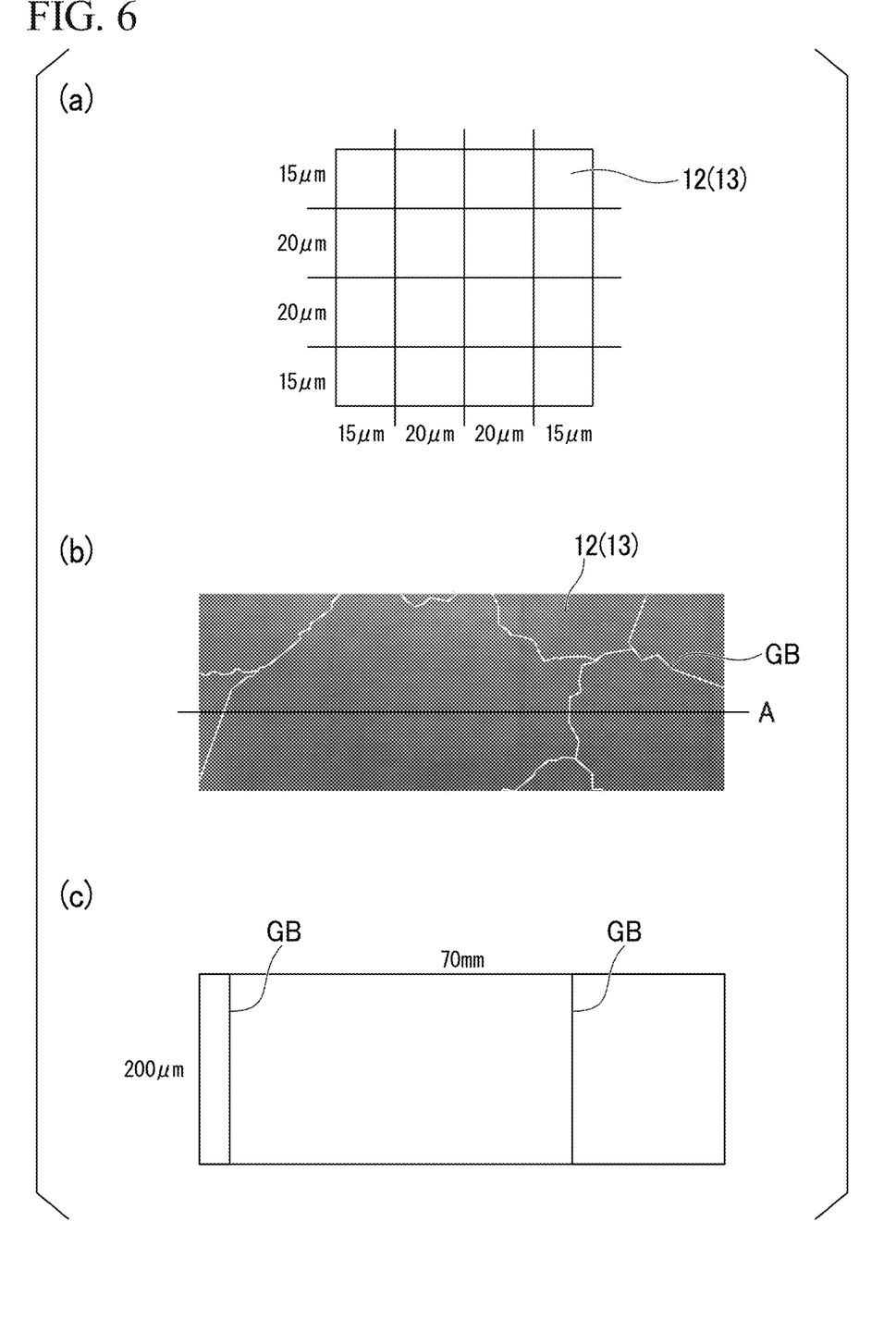
FIG. 6 is an explanatory view showing a method of calculating a crystal grain boundary length in a section of a metal layer from the observation of the surface of the metal layer in Examples.

In the case in which coarse crystal grains having grain size of 80% or more of the thickness of the metal layer are present, as shown in FIG. 6(*a*), three straight lines were drawn on the surface of the metal layer in vertical and horizontal directions respectively, and a grain boundary GB having a length the same as the thickness of the metal layer in the thickness direction of the metal layer is considered to be present in a place where the straight line intersects the grain boundary GB in a range of 70 µm×70 µm (FIG. 6(*b*)), and thus a grain boundary length L per mm² in the section was calculated (FIG. 6(*c*)).

In the examples shown in FIG. 6(*c*), the section at the position of a straight line A in FIG. 6(*b*) is shown. The grain boundary length is 400 µm, the area of the section is 14 mm², and the grain boundary length L per mm² is 0.03 mm.

TABLE 1

| | Aluminum plate | | | Heat treatment condition | | Crystal grain size after heat treatment (µm) | Surface alteration of metal layer | Bonding rate of metal layer (%) | Grain boundary length L of metal layer per mm² (mm) |
|---|---|---|---|---|---|---|---|---|---|
| | Purity (mass %) | Solidus temperature (° C.) | Thickness (mm) | Heat treatment temperature (° C.) | Holding time (min) | | | | |
| Example 1 | 99.0 | 643 | 0.2 | 640 | 60 | * | A | 99.5 | 0.08 |
| Example 2 | 99.9 | 650 | 0.2 | 500 | 30 | 40.0 | A | 99.4 | 0.07 |
| Example 3 | 99.5 | 646 | 0.1 | 500 | 30 | 30.0 | B | 97.5 | 0.08 |
| Example 4 | 99.5 | 646 | 0.38 | 500 | 30 | 30.0 | A | 99.6 | 0.07 |
| Example 5 | 99.5 | 646 | 0.2 | 400 | 30 | 24.0 | B | 99.5 | 0.07 |

TABLE 1-continued

| | Aluminum plate | | | Heat treatment condition | | Crystal grain size after heat treatment (μm) | Surface alteration of metal layer | Bonding rate of metal layer (%) | Grain boundary length L of metal layer per mm² (mm) |
|---|---|---|---|---|---|---|---|---|---|
| | Purity (mass %) | Solidus temperature (° C.) | Thickness (mm) | Heat treatment temperature (° C.) | Holding time (min) | | | | |
| Example 6 | 99.5 | 646 | 0.2 | 450 | 30 | 27.0 | B | 99.3 | 0.08 |
| Example 7 | 99.5 | 646 | 0.2 | 500 | 30 | 30.5 | A | 99.9 | 0.06 |
| Example 8 | 99.5 | 646 | 0.2 | 540 | 30 | 33.2 | A | 99.7 | 0.05 |
| Example 9 | 99.5 | 646 | 0.2 | 560 | 30 | 36.4 | A | 99.7 | 0.06 |
| Example 10 | 99.5 | 646 | 0.2 | 580 | 30 | * | A | 99.9 | 0.07 |
| Example 11 | 99.5 | 646 | 0.2 | 640 | 30 | * | A | 99.9 | 0.08 |
| Example 12 | 99.5 | 646 | 0.2 | 645 | 30 | * | A | 99.9 | 0.07 |
| Comparative Example 1 | 99.5 | 646 | 0.2 | 350 | 30 | 21.1 | C | 97.1 | 20 |
| Conventional Example | 99.5 | 646 | 0.2 | — | — | 5.1 | C | 97.2 | 17 |

*Crystal grains are coarse and not measurable by this method.

In Comparative Example in which the heat treatment temperature of the aluminum plate was as low as 350° C., the grain boundary length L of the metal layer per mm² was 20 mm and was very long, and the surface alteration of the metal layer occurred in a range of 30% or more of the total area. In addition, the bonding rate was as low as 97.1%.

Similarly, in Conventional Example in which a heat treatment for the aluminum plate was not carried out, the grain boundary length L of the metal layer per mm² was 17 mm and was very long, and the surface alteration of the metal layer occurred in a range of 30% or more of the total area. In addition, the bonding rate was as low as 97.2%.

In Comparative Example and Conventional Example, it is assumed that since there are a large number of crystal grain boundaries and Si in the Al—Si-based brazing filler material diffuses into the surface via the crystal grain boundaries, surface alteration occurs.

In addition, it is assumed that the amount of Si in the vicinity of the bonding interface becomes insufficient due to Si diffusion and the bonding rate is deteriorated.

In contrast, in Examples 1 to 12 in which the aluminum plate of aluminum having a purity of 99.0 mass % or higher and 99.9 mass % or lower was subjected to a heat treatment in a range of 400° C. or higher and lower than a solidus temperature, the grain boundary length L of the metal layer per mm² was 0.1 mm or less and the surface alteration of the metal layer was sufficiently prevented. In addition, the bonding rate was as high as 97.5% or higher. It is assumed that this is because there are a small number of crystal grain boundaries and the migration of Si in the Al—Si-based brazing filler material is prevented.

From the results of the above confirmation test, it was confirmed that according to Examples, it was possible to provide a power module substrate (ceramic-aluminum bonded body) capable of preventing Si from diffusing to the surface of the metal layer (aluminum member), preventing the surface alteration of the metal layer (aluminum member), and reliably bonding the ceramic substrate (ceramic member) and the metal layer (aluminum member).

INDUSTRIAL APPLICABILITY

According to the method for producing a ceramic-aluminum bonded body and the method for producing a power module substrate of the present invention, the ceramic member and the aluminum member can be bonded in a satisfactory manner. Therefore, according to the method for producing a bonded body and the method for producing a power module substrate according to the present invention, it is possible to produce a ceramic-aluminum bonded body and a power module substrate suitable for a power module, which is used under a severe environment, such as a power semiconductor element for high power control used to control wind power generation, an electric vehicle such as an electric automobile, and the like.

REFERENCE SIGNS LIST

10: Power module substrate (ceramic-aluminum bonded body)
11: Ceramic substrate (ceramic member)
12: Circuit layer
13: Metal layer
22: Aluminum plate (aluminum member)
23: Aluminum plate (aluminum member)
24: Al—Si-based brazing filler material
25: Al—Si-based brazing filler material
GB: Grain boundary

The invention claimed is:

1. A method for producing a ceramic-aluminum bonded body obtained by bonding a ceramic member and an aluminum member,
the aluminum member before bonding being composed of aluminum having a purity of 99.0 mass % or higher and 99.9 mass % or lower,
the method comprising:
a heat treatment step of subjecting the aluminum member to a heat treatment in a range of 500° C. or higher and 645° C. or lower;
a subsequent cooling step of cooling the aluminum member to room temperature; and
a bonding step of bonding the aluminum member after the cooling step and the ceramic member via a brazing filler material including Si.

2. A method for producing a power module substrate which includes a ceramic substrate and an aluminum plate that is bonded to the ceramic substrate,
the aluminum plate before bonding being composed of aluminum having a purity of 99.0 mass % or higher and 99.9 mass % or lower, the method comprising:
bonding the aluminum plate and the ceramic substrate by the method for producing a ceramic-aluminum bonded body according to claim 1.

3. The method for producing a ceramic-aluminum bonded body according to claim 1,
wherein after the heat treatment step, the crystal grain size of the aluminum member is 24.0 μm to 40.0 μm.

4. The method for producing a ceramic-aluminum bonded body according to claim 1,
wherein the thickness of the aluminum member is in a range of 0.05 mm or more and less than 0.4 mm.

5. The method for producing a ceramic-aluminum bonded body according to claim 1,
wherein the method further comprises a laminating step of laminating the aluminum member on one surface of the ceramic member via the brazing filler material including Si after the cooling step and before the bonding step.

\* \* \* \* \*